(12) United States Patent
King et al.

(10) Patent No.: US 6,825,679 B2
(45) Date of Patent: Nov. 30, 2004

(54) ELECTRICALLY CONDUCTIVE STRUCTURE AND METHOD FOR IMPLEMENTING CIRCUIT CHANGES ON PRINTED CIRCUIT BOARDS

(75) Inventors: Philip N King, Ft Collins, CO (US); Stephen Willard, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/199,142

(22) Filed: Jul. 19, 2002

(65) Prior Publication Data

US 2004/0012401 A1 Jan. 22, 2004

(51) Int. Cl.[7] ............................................. G01R 31/02
(52) U.S. Cl. ..................... 324/754; 324/158.1; 174/261
(58) Field of Search .......................... 324/754, 755–757, 324/761–762, 765, 158.1; 29/827, 830, 846, 848, 852; 174/250, 259, 261–263; 361/704, 720, 748, 751; 428/544, 560, 570

(56) References Cited

U.S. PATENT DOCUMENTS

| | | | | |
|---|---|---|---|---|
| 2,808,352 A | * | 10/1957 | Coleman et al. | 428/560 |
| 4,724,383 A | * | 2/1988 | Hart | 324/754 |
| 5,060,370 A | * | 10/1991 | Scales et al. | 29/846 |
| 5,829,127 A | * | 11/1998 | Hagner | 29/846 |

FOREIGN PATENT DOCUMENTS

| | | |
|---|---|---|
| DE | 3943261 A | 7/1991 |
| EP | 0 113 820 | 11/1983 |
| GB | 2 111 759 | 12/1982 |
| JP | 56008891 | 1/1981 |

* cited by examiner

*Primary Examiner*—David Zarneke
*Assistant Examiner*—Minh N. Tang

(57) ABSTRACT

An electrically conductive structure and method for making circuit changes on a printed circuit board involves the use of electrically conductive tape to connect two previously unconnected points on the board. One or more sections of the tape may be used to form a low-profile contiguous path between two previously unconnected points on the board.

17 Claims, 4 Drawing Sheets

ELECTRICALLY CONDUCTIVE STRUCTURE AND METHOD FOR IMPLEMENTING CIRCUIT CHANGES ON PRINTED CIRCUIT BOARDS

BACKGROUND OF THE INVENTION

Wireless test fixtures, when used in combination with in-circuit testers for target printed circuit boards (PCBs), allow for quick and accurate testing of PCBs by providing the necessary electrical and mechanical connections between points of interest on the target PCB with the testing interface of the particular tester being used. A simplified diagram of one such wireless fixture 100 is shown in FIG. 1. A target PCB 105, typically populated with electronic components 107, is held in a stable fashion by a target board support 130. A plurality of probes 135 make contact at one end with points of interest on the target PCB 105 to be tested. The other end of each probe 135 makes contact with electrical contact points on one side of a fixture PCB 110. On the opposite side of the fixture PCB 110 are another set of electrical contact points, each of which is associated with a pin 120. The pins 120 are utilized to connect various points of the fixture PCB 110, with a testing interface 115 of the tester, shown without detail in FIG. 1.

Thus, the fixture PCB 110 is employed as a way of mechanically customizing the testing interface 115 for any particular target PCB 105. Typically, significant forces are applied to one or both sides of the fixture PCB 110 by way of the probes 135 and the pins 120. To prevent inordinate flexing of the fixture PCB 110 under such forces, structural elements, such as spacers 140 and fixture adapter 125, are employed. These structural elements may predominantly reside on the upper or lower side, or both, of the fixture PCB 110.

Some such structural elements may make direct contact with the fixture PCB 110 over a significant portion of the fixture PCB 110. For example, the fixture adapter 125 may contain a number of holes (not shown in FIG. 1) through which the pins 120 protrude to make contact with the fixture PCB 110. Areas of the top of the fixture adapter 125 not occupied by the pins 120 therefore make direct contact with the fixture PCB 110 to provide mechanical support. In other wireless test fixture designs, a structural element may reside atop the fixture PCB 10, making direct contact with much of the top side of the fixture PCB 110 for support.

Unfortunately, such contact has been shown to cause problems when changes to the connections embodied in the fixture PCB 110 are required. These changes are often necessitated by modifications in test strategy, causing a change in the number of points of interest to be checked or a modification in how the points of interest are tested. Also, design modifications made to the target PCB 105 may cause a change of location in the points of interest on the target PCB 105. As a result of these modifications, commensurate changes in the location or number of the probes 135, or in how the probes 135 are connected to the pins 120, are required. In such cases, changes in the electrical connections implemented within the fixture PCB 110 are necessary.

The changes in the fixture PCB 110 are normally implemented in part by way of one or more standard, round, insulated wires, such as small-gauge wire-wrap wires. With respect to the wireless fixture 100, such wires, when residing on the bottom side of the fixture PCB 110, are compressed between the fixture PCB 110 and the fixture adapter 125, potentially causing bending of the fixture PCB 110. For variants of test fixtures with structural elements in contact with the top of the fixture PCB 110, wire-wrap wires existing on the top of the fixture PCB 110 would create similar problems. If the fixture PCB 110 is not maintained sufficiently flat within certain limits, the probes 135 and pins 120 may not make sufficient contact with the fixture PCB 110 in the proper locations, causing undesirable disconnections between the testing interface 115 and the target PCB 105. Also, physical damage to the wires implementing the changes may occur. Such damage is exacerbated in situations where two of the wires cross, as the insulation between the two wires may be compromised, causing a short circuit between those wires.

The wires also potentially cause obstruction of the points on the fixture PCB 110 at which the probes 135 and the pins 120 make contact. This problem may be remedied by gluing the wires to the side of the fixture PCB 110 to restrict the movement of the wires, but such a task is rather time-consuming.

Therefore, from the foregoing, a new structure and method that allows for low-profile, low-movement implementations of circuit changes on a printed circuit board would be advantageous.

SUMMARY OF THE INVENTION

Embodiments of the present invention, to be discussed in detail below, represent a structure and method that allow circuit changes to be made to a printed circuit board that occupy an insignificant amount of space above the board, and are essentially stationary. Where two previously unconnected points on a side of the printed circuit board must be connected, electrically conductive tape is applied to the side of the printed circuit board to define a contiguous path between the two points.

Electrically conductive tape is often backed with an adhesive, thus restricting the movement of the tape when applied to the board with the adhesive. Also, conductive tape is typically quite thin compared to the type of wire normally used for such PCB circuit changes, thus occupying less space above the board compared to that wire so that mechanical tolerance problems due to bending of the printed circuit board are significantly reduced.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

Figure 1:
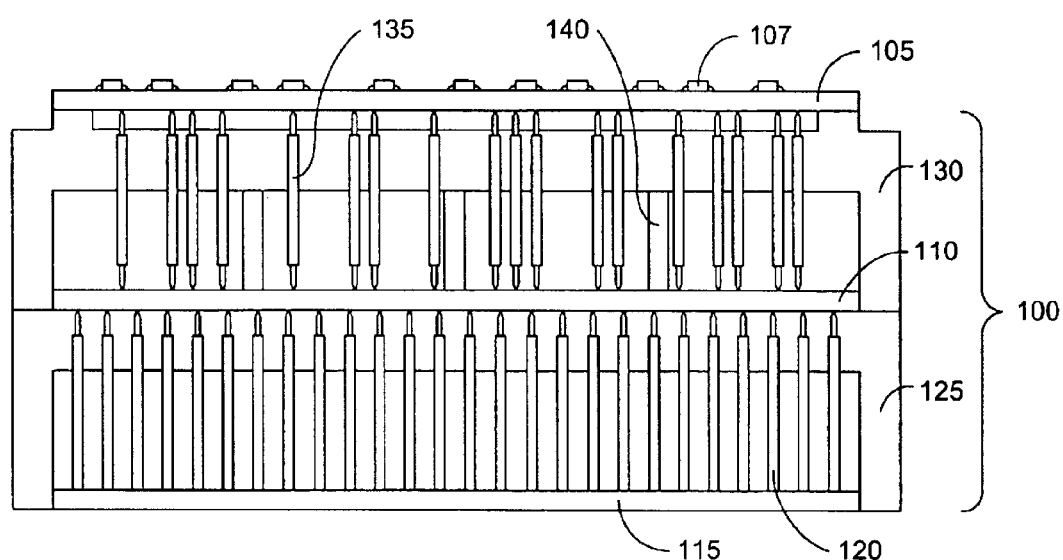
FIG. 1 is a simplified side view of a wireless test fixture for an in-circuit printed circuit board tester from the prior art.
Figure 2:
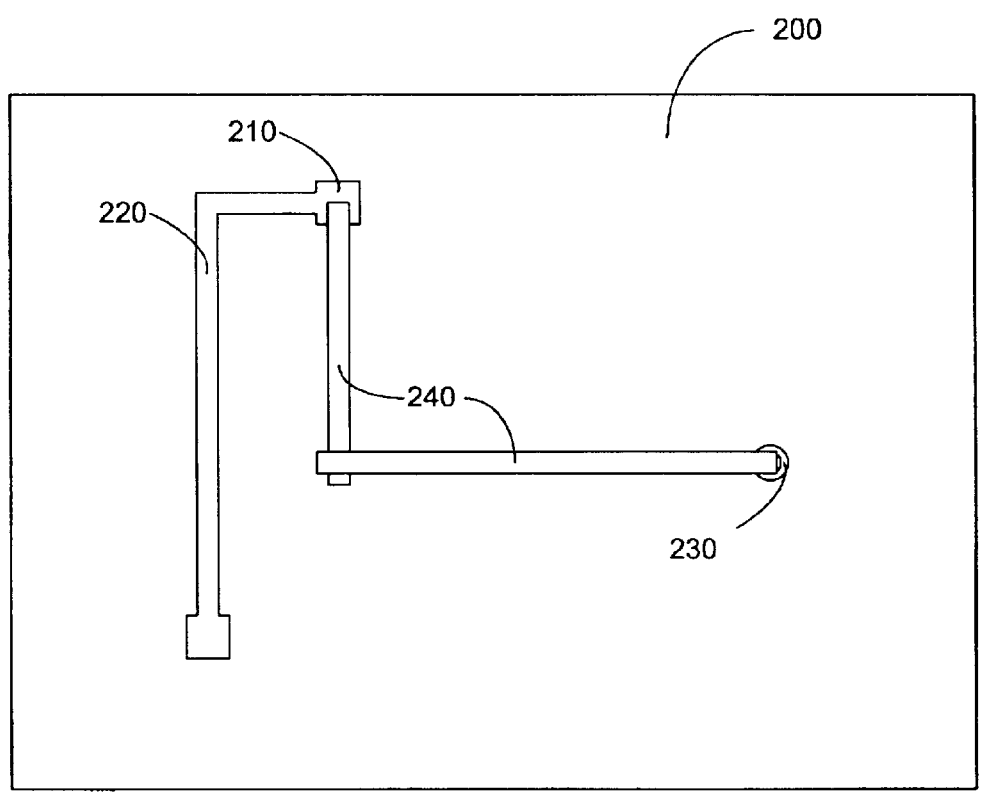
FIG. 2 is a simplified plan diagram of a printed circuit board exhibiting a circuit change according to an embodiment of the invention.

A simplified printed circuit board (PCB) 200 exhibiting a circuit change employing an embodiment of the invention is shown in FIG. 2. The PCB 200 may be a fixture PCB for a wireless fixture of a PCB in-circuit test, but the embodiments of the invention described herein may also be applied where clearance above the PCB is extremely restricted. Assuming a circuit trace 220 with a connection pad 210, and a via 230 not connected to the pad 210, one or more sections 240 of an electrically conductive tape may be used to form a contiguous path that would provide electrical continuity between the pad 210 and the via 230. The sections 240 of tape also are possibly backed with a conductive adhesive to restrict the motion of the sections 240 with respect to the PCB 200. In the specific example of FIG. 2, two sections 240 of conductive tape are utilized, potentially to avoid various features, such as other connection pads or vias on the PCB 200. Of course, only one section 240 of the tape may be necessary for many applications, whereas multiple sections 240 may be required for connection of more remote points on the PCB 200. The ends of the sections 240 of the conductive tape are then possibly soldered (not shown) to the points of the PCB 200 being connected, which in this case are the connection pad 210 and the via 230. However, if the two sections 240 are backed with a conductive adhesive, no soldering may be required. Additionally, the two sections 240 may also be soldered to each other to ensure connectivity between the two sections 240. However, as before, if the sections of the conductive tape employ a conductive adhesive, and tend to adhere to each other, this additional action may not be necessary.

Furthermore, most types of electrically conductive tape are capable of being folded to form bends or corners. When the tape is manipulated in such a manner, the use of multiple sections of tape, such as the two sections 240, may not be required; a single section may suffice in such cases.

The electrically conductive tape utilized in embodiments of the present invention may be, but is not limited to, copper foil tape, which normally can be purchased in rolls of various widths ranging from approximately 0.5 millimeters to 24 inches. Small widths, on the order of approximately 1 millimeter, have been shown to be effective in connecting previously unconnected points on a PCB, although other widths may be employed, depending on the particular application.

The thickness of many types of electrically conductive tape is on the order of two mils thick, which is exceptionally thin in comparison to most PCBs, as well as to most wire typically used to implement PCB circuit changes. The thin nature of the tape allows circuit changes using the tape to be extremely low-profile in nature, thus allowing structural elements to be placed in contact with the PCB 200 and the tape without any significant adverse effects to the tolerances between the PCB 200 and the structural elements.

As mentioned above, in some embodiments the conductive tape is backed with an adhesive. This particular feature restricts the movement of the conductive tape once it is applied to the PCB 200 by way of the adhesive. In lieu of adhesive backing, other methods of restricting the movement of the tape may be utilized, including, but not limited to, gluing the tape to the PCB 200. Additionally, depending on the length and width of the tape being used, and other factors, no method of affixing the tape to the PCB 200 may be necessary for a particular application.

Figure 3:
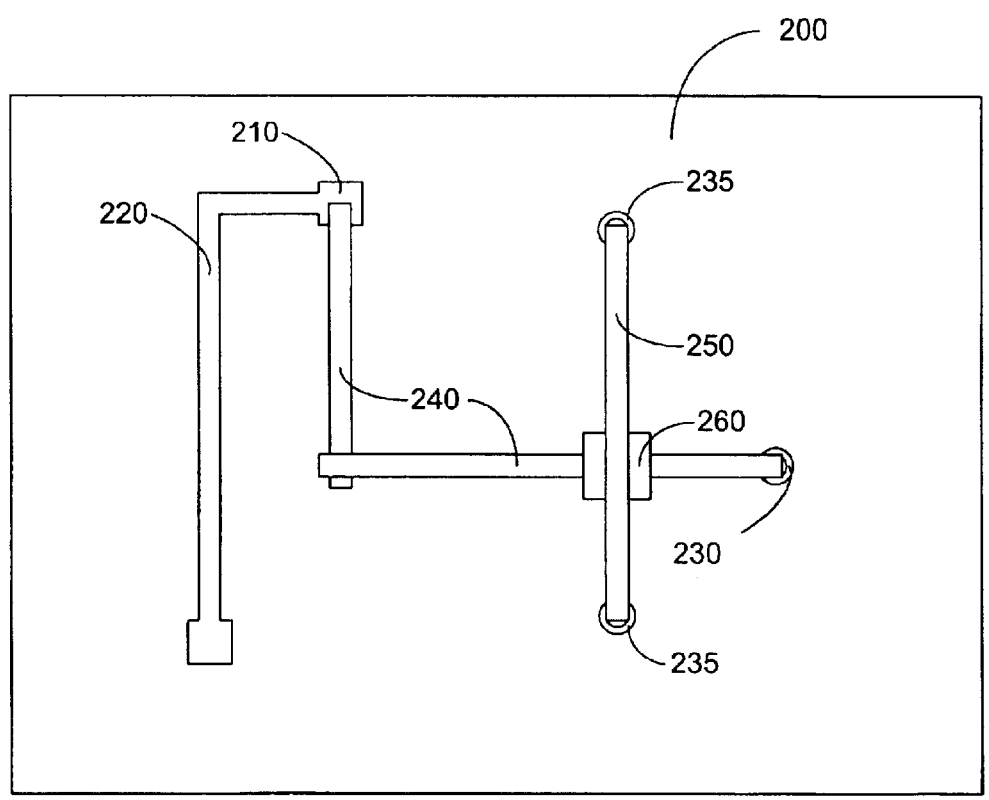
FIG. 3 is a simplified plan diagram of a printed circuit board exhibiting a circuit change according to an embodiment of the invention, wherein two separate circuit changes cross paths.

FIG. 3 shows the same PCB 200, with an additional circuit change included. In this case, a single section 250 of the electrically conductive tape bridges two vias 235. Due to the position of the two vias 235, the single section 250 of conductive tape crosses the path of the one of the previous sections 240 of tape, shown in both FIG. 2 and FIG. 3. In some embodiments of the present invention, a small piece of insulating tape 260 may be applied onto the previous section 240 of tape prior to applying the single section 250 to the board. This action would help prevent the previous section 240 and the single section 250 of conductive tape from coming into contact with each other, especially if any force is applied to that particular area of the PCB 200, such as by way of a structural element of a wireless fixture. The piece of insulating tape 260 may also be used to protect a section of conductive tape from direct mechanical damage, even in the absence of overlapping sections of conductive tape.

Figure 4:
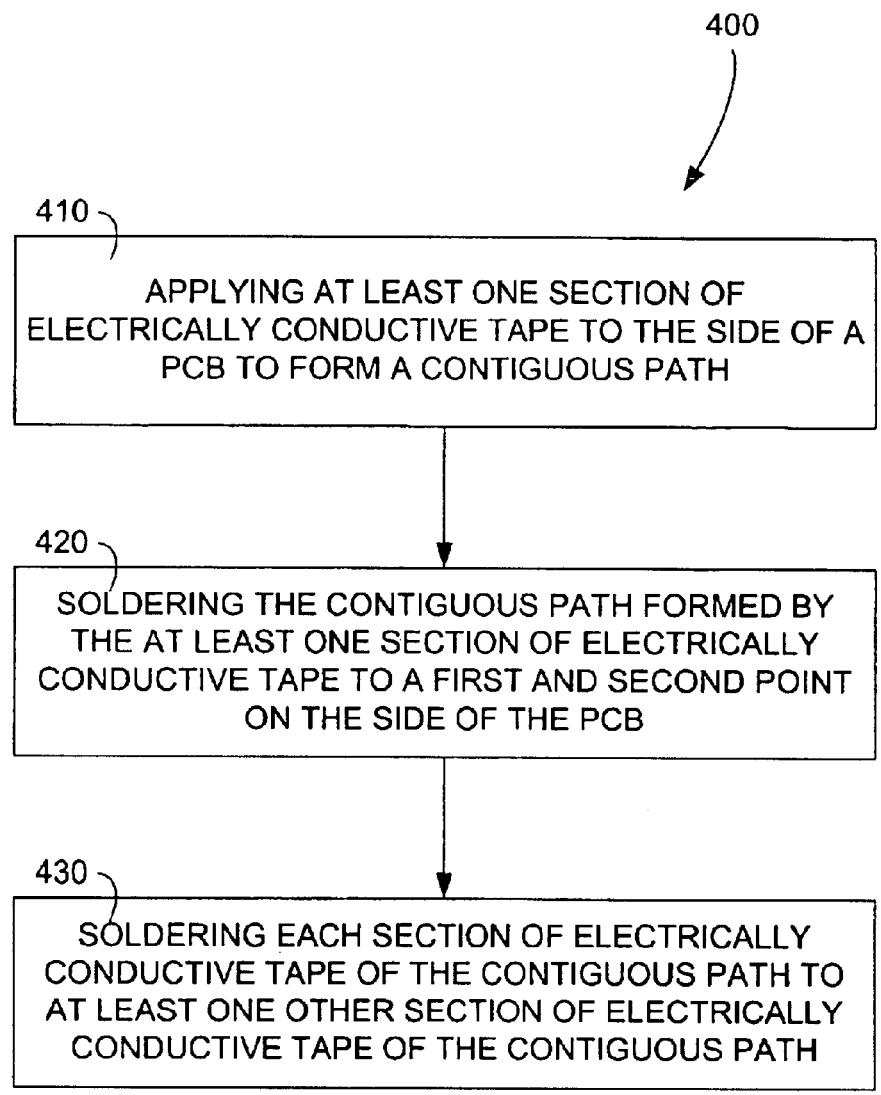
FIG. 4 is a flowchart describing a method of implementing a circuit change on a printed circuit board according to an embodiment of the invention.

The invention herein disclosed is also embodied as a method of implementing circuit changes to a printed circuit board. As displayed in FIG. 4, a method 400 according to an embodiment of the invention connects two points on a side of a PCB. First, at least one section of electrically conductive tape is applied to the side of the PCB to form a contiguous path (step 410). The ends of the contiguous path may then be soldered to the first and second points of the PCB (step 420). Additionally, to ensure electrical conductivity between the first and second points, the sections of the conductive tape that form the contiguous path may be soldered together (step 430). As stated above, the use of an electrically conductive tape with conductive backing may eliminate the need for any soldering.

From the foregoing, the embodiments of the invention discussed above have been shown to provide an electrically conductive structure and method for implementing circuit changes on printed circuit boards. In addition, other specific structures and methods embodying the invention are also possible. Therefore, the present invention is not to be limited to the specific forms so described and illustrated; the invention is limited only by the claims.

What is claimed is:

1. An electrically conductive structure for connecting a first and second points on a side of a printed circuit board (PCB), comprising:
    at least one section of electrically conductive tape applied to the side of the PCB to form a contiguous path, the electrically conductive tape being linear in shape, millimeter or less in width, and of sufficient thinness to allow a structural element to be placed in contact with the PCB and the electrically conductive tape without significant mechanical interference between the structural element and the PCB.

2. The electrically conductive structure of claim 1, further comprising solder joints connecting the contiguous path with the first and second points on the side of the PCB.

3. The electrically conductive structure of claim 2, further comprising solder joints connecting each section of electrically conductive tape of the contiguous path to at least one other section of electrically conductive tape of the contiguous path.

4. The electrically conductive structure of claim 1, wherein the electrically conductive tape is applied to the side of the PCB by way of an adhesive backing resident on the tape.

5. The electrically conductive structure of claim 4, wherein the adhesive backing is conductive.

6. The electrically conductive structure of claim 1, further comprising a section of insulating tape applied to the at least one section of electrically conductive tape.

7. The electrically conductive structure of claim 1, wherein the PCB is a part of a wireless PCB test fixture.

8. The electrically conductive structure of claim 1, wherein the electrically conductive tape is copper foil tape.

9. A wireless test fixture, comprising:

a target board support configured to support a target PCB to be tested;

a plurality of probes, each probe having a first and second ends, each probe being configured to make contact at the first end with the target PCB;

a plurality of pins, each pin having a first and second end, each pin being configured to make contact at the first end with a testing interface;

a fixture PCB configured to provide electrical connectivity between the second end of each of the plurality of probes and the second end of each of the plurality of pins, the fixture PCB being modified by way of the electrically conductive structure of claim 1; and a fixture adapter configured to hold the fixture PCB, the fixture adapter providing support to prevent substantial warping of the fixture PCB.

10. A method of electrically connecting a first and second points on a side of a printed circuit board (PCB), the method comprising the step of:

applying at least one section of electrically conductive tape to the side of the PCB to form a contiguous path, the electrically conductive tape being linear in shape, a millimeter or less in width, and of sufficient thinness to allow a structural element to be place in contact with the PCB and the electrically conductive tape without significant mechanical interference between the structural element and the PCB.

11. The method of claim 10, further comprising soldering the contiguous path to the first and second points.

12. The method of claim 11, further comprising soldering each section of electrically conductive tape of the contiguous path to at least one other section of electrically conductive tape of the contiguous path.

13. The method of claim 10, wherein the electrically conductive tape is applied to the side of the PCB by way of an adhesive backing resident on the tape.

14. The method of claim 13, wherein the adhesive backing is conductive.

15. The method of claim 10, further comprising placing a section of insulating tape onto the at least one section of electrically conductive tape.

16. The method of claim 10, wherein the PCB is a part of a wireless PCB test fixture.

17. The method of claim 10, wherein the electrically conductive tape is copper foil tape.

* * * * *